(12) United States Patent
Tunga et al.

(10) Patent No.: US 11,756,911 B2
(45) Date of Patent: *Sep. 12, 2023

(54) METAL PAD MODIFICATION

(71) Applicant: International Business Machines Corporation, Armonk, NY (US)

(72) Inventors: Krishna Tunga, Wappingers Falls, NY (US); Ekta Misra, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 166 days.

This patent is subject to a terminal disclaimer.

(21) Appl. No.: 16/438,578

(22) Filed: Jun. 12, 2019

(65) Prior Publication Data
US 2019/0295978 A1 Sep. 26, 2019

Related U.S. Application Data

(63) Continuation of application No. 16/010,712, filed on Jun. 18, 2018, now Pat. No. 10,373,925, which is a
(Continued)

(51) Int. Cl.
H01L 23/00 (2006.01)

(52) U.S. Cl.
CPC .............. H01L 24/13 (2013.01); H01L 24/05 (2013.01); *H01L 2224/03462* (2013.01);
(Continued)

(58) Field of Classification Search
CPC . H01L 2224/13014; H01L 2224/05015; H01L 2224/05555; H01L 2224/05552; H01L 2224/05012; H01L 2224/13027; H01L 2224/13082; H01L 2224/05025; H01L 2224/0557; H01L 2224/0401;
(Continued)

(56) References Cited

U.S. PATENT DOCUMENTS 5,268,568 A 12/1993 Lee
5,875,102 A 2/1999 Barrow
(Continued)

OTHER PUBLICATIONS

Barwicz, et al., "A Novel Approach to Photonic Packaging Leveraging Existing High-Throughput Microelectronic Facilities," IEEE Journal of Selected Topics in Quantum Electronics, vol. 22, No. 6, Nov./Dec. 2016, 12 pages.
(Continued)

*Primary Examiner* — Jasmine J Clark
(74) *Attorney, Agent, or Firm* — Jared C. Chaney

(57) ABSTRACT

The present invention provides a structure. In an exemplary embodiment, the structure includes a base material, at least one metal pad, where a first surface of the metal pad is in contact with the base material, and a metal pedestal, where the metal pedestal is in contact with the metal pad, where a radial alignment of the metal pad is shifted by an offset distance, with respect to the metal pedestal, such that the metal pad is shifted towards a center axis of the base material, where a first dimension of the metal pad is smaller than a second dimension of the metal pad, where the second dimension is orthogonal to a line running from a center of the metal pad to the center axis of the base material, where the first dimension is parallel to the line.

3 Claims, 7 Drawing Sheets

Related U.S. Application Data continuation of application No. 15/636,038, filed on Jun. 28, 2017, now Pat. No. 10,090,271.

(52) U.S. Cl.
CPC ............... *H01L 2224/03464* (2013.01); *H01L 2224/0401* (2013.01); *H01L 2224/056* (2013.01); *H01L 2224/05012* (2013.01); *H01L 2224/05015* (2013.01); *H01L 2224/05025* (2013.01); *H01L 2224/05027* (2013.01); *H01L 2224/0557* (2013.01); *H01L 2224/05124* (2013.01); *H01L 2224/05144* (2013.01); *H01L 2224/05147* (2013.01); *H01L 2224/05552* (2013.01); *H01L 2224/05555* (2013.01); *H01L 2224/05572* (2013.01); *H01L 2224/05624* (2013.01); *H01L 2224/05644* (2013.01); *H01L 2224/05647* (2013.01); *H01L 2224/05686* (2013.01); *H01L 2224/10126* (2013.01); *H01L 2224/11462* (2013.01); *H01L 2224/11464* (2013.01); *H01L 2224/13014* (2013.01); *H01L 2224/13027* (2013.01); *H01L 2224/13082* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13166* (2013.01); *H01L 2224/13186* (2013.01); *H01L 2224/81815* (2013.01); *H01L 2924/3512* (2013.01); *H01L 2924/35121* (2013.01)

(58) Field of Classification Search
CPC ........... H01L 2224/10126; H01L 24/05; H01L 2924/35121; H01L 24/13; H01L 24/10; H01L 2224/05686; H01L 2224/05624; H01L 2224/13166; H01L 2224/056; H01L 2924/3512; H01L 2224/13124; H01L 2224/05644; H01L 2224/11464; H01L 2224/13144; H01L 2224/13186; H01L 2224/13113; H01L 2224/13116; H01L 2224/13139; H01L 2224/13147; H01L 2224/05124; H01L 2224/05147; H01L 2224/05647; H01L 2224/05572; H01L 2224/11462; H01L 2224/05144; H01L 2224/03464; H01L 2224/05027; H01L 2224/81815; H01L 2224/03462

See application file for complete search history.

(56) References Cited

U.S. PATENT DOCUMENTS

| | | | |
|---|---|---|---|
| 6,774,474 B1 | 8/2004 | Caletka et al. | |
| 6,833,615 B2 | 12/2004 | Geng et al. | |
| 7,095,116 B1 | 8/2006 | Kelkar et al. | |
| 7,300,825 B2 | 11/2007 | Greco et al. | |
| 7,382,005 B2 | 6/2008 | Lin et al. | |
| 7,772,104 B2 | 8/2010 | Pham et al. | |
| 7,812,438 B2 | 10/2010 | Jadhav et al. | |
| 7,888,257 B2 | 2/2011 | Antol et al. | |
| 7,915,741 B2 | 3/2011 | Lau et al. | |
| 8,026,602 B2* | 9/2011 | Ke | H01L 24/11 257/737 |
| 8,178,967 B2 | 5/2012 | Lee et al. | |
| 8,298,929 B2 | 10/2012 | Daubenspeck et al. | |
| 9,093,440 B2 | 7/2015 | Tu et al. | |
| 9,233,835 B2 | 1/2016 | Aleksov et al. | |
| 9,397,059 B2 | 7/2016 | Cha et al. | |
| 9,881,885 B2* | 1/2018 | Kuo | H04L 24/13 |
| 10,090,271 B1 | 10/2018 | Tunga et al. | |
| 10,373,925 B2* | 8/2019 | Tunga | H01L 24/13 |
| 2003/0020163 A1 | 1/2003 | Hung et al. | |
| 2003/0153171 A1* | 8/2003 | Kim | H04L 24/13 438/612 |
| 2005/0263883 A1* | 12/2005 | Wang | H01L 24/05 257/737 |
| 2006/0234489 A1* | 10/2006 | Wang | H01L 24/11 438/611 |
| 2006/0258137 A1 | 11/2006 | Ke et al. | |
| 2009/0104769 A1* | 4/2009 | Lee | H01L 23/114 438/653 |
| 2014/0021600 A1 | 1/2014 | Daubenspeck et al. | |
| 2014/0264890 A1* | 9/2014 | Breuer | H01L 24/11 257/773 |
| 2015/0214170 A1 | 7/2015 | Chen et al. | |
| 2015/0262951 A1 | 9/2015 | Lee et al. | |
| 2017/0263585 A1 | 9/2017 | Homma et al. | |

OTHER PUBLICATIONS

Tunga, et al., "Stress Reduction Methods Within the Far Back End of Line (FBEOL) for Fine Pitch and 2.5D/3D Packaging Configurations," 15th IEEE Intersociety Conference on Thermal and Thermomechanical Phenomena in Electronic Systems, ITHERM, 2016, 8 pages.

Misra, et al., "Role of FBEOL Al pads and hard dielectric for improved mechanical performance in lead-free C4 products," Electronic Components and Technology Conference (ECTC), 2013 IEEE 63rd, 2013, 6 pages.

Tunga et al., "Metal Pad Modification," U.S. Appl. No. 15/636,038, filed Jun. 28, 2017.

IBM List of Patents or Patent Publications Treated as Related, Dated Jun. 11, 2019, 2 pages.

"Accelerated Examination Support Document," International Business Machines Corporation, Dated Feb. 23, 2018, 17 pages.

Tunga et al., "Metal Pad Modification," U.S. Appl. No. 15/903,236, filed Feb. 23, 2018.

"Accelerated Examination Support Document," International Business Machines Corporation, Dated Apr. 15, 2019, 24 pages.

Tunga et al., "Metal Pad Modification," U.S. Appl. No. 16/010,712, filed Jun. 18, 2018.

Tunga et al., "Metal Pad Modification," U.S. Appl. No. 16/390,193, filed Apr. 22, 2018.

* cited by examiner

METAL PAD MODIFICATION

BACKGROUND

The present disclosure relates to integrated circuit chips, and more specifically, to metal pad modification.

SUMMARY

The present invention provides a structure. In an exemplary embodiment, the structure includes a base material, at least one metal pad, where a first surface of the metal pad is in contact with a surface of the base material, a metal pedestal, where a first surface of the metal pedestal is in contact with a second surface of the metal pad, where a radial alignment of the metal pad is shifted by an offset distance, with respect to the metal pedestal, such that the metal pad is shifted towards a center axis of the base material, where a first dimension of the metal pad is smaller than a second dimension of the metal pad, where the second dimension is orthogonal to a line running from a center of the metal pad to the center axis of the base material, where the first dimension is parallel to the line running from the center of the metal pad to the center axis of the base material, and a solder bump in contact with a second surface of the metal pedestal.

In an exemplary embodiment, the structure includes a base material, at least one metal pad, where a first surface of the metal pad is in contact with a surface of the base material, a metal pedestal, where a first surface of the metal pedestal is in contact with a second surface of the metal pad, where a radial alignment of the metal pad is shifted by an offset distance, with respect to the metal pedestal, such that the metal pad is shifted towards a center axis of the base material, and a solder bump in contact with a second surface of the metal pedestal.

In an exemplary embodiment, the structure includes a base material, at least one metal pad, where a first surface of the metal pad is in contact with a surface of the base material, a metal pedestal, where a first surface of the metal pedestal is in contact with a second surface of the metal pad, where a first dimension of the metal pad is smaller than a second dimension of the metal pad, where the second dimension is orthogonal to a line running from a center of the metal pad to the center axis of the base material, where the first dimension is parallel to the line running from the center of the metal pad to the center axis of the base material, and a solder bump in contact with a second surface of the metal pedestal.

DETAILED DESCRIPTION

Figure 1:
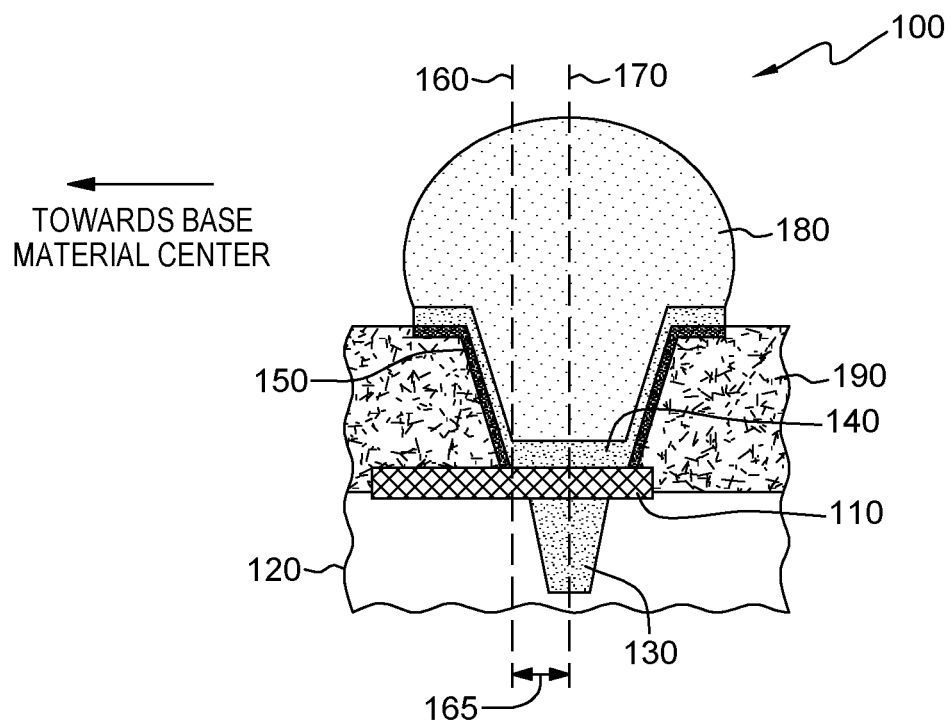
FIG. 1 depicts a diagram in accordance with an exemplary embodiment of the present invention.

The present invention provides a structure. In an exemplary embodiment, the structure includes a base material, at least one metal pad, where a first surface of the metal pad is in contact with a surface of the base material, a metal pedestal, where a first surface of the metal pedestal is in contact with a second surface of the metal pad, where a radial alignment of the metal pad is shifted by an offset distance, with respect to the metal pedestal, such that the metal pad is shifted towards a center axis of the base material, where a first dimension of the metal pad is smaller than a second dimension of the metal pad, where the second dimension is orthogonal to a line running from a center of the metal pad to the center axis of the base material, where the first dimension is parallel to the line running from the center of the metal pad to the center axis of the base material, and a solder bump in contact with a second surface of the metal pedestal. In an embodiment, the line running from a center of the metal pad to the center axis of the base material is not an actual line but a constructive line used only for reference.

In an exemplary embodiment, the structure includes a base material, at least one metal pad, where a first surface of the metal pad is in contact with a surface of the base material, a metal pedestal, where a first surface of the metal pedestal is in contact with a second surface of the metal pad, where a radial alignment of the metal pad is shifted by an offset distance, with respect to the metal pedestal, such that the metal pad is shifted towards a center axis of the base material, and a solder bump in contact with a second surface of the metal pedestal.

In an exemplary embodiment, the structure includes a base material, at least one metal pad, where a first surface of the metal pad is in contact with a surface of the base material, a metal pedestal, where a first surface of the metal pedestal is in contact with a second surface of the metal pad, where a first dimension of the metal pad is smaller than a second dimension of the metal pad, where the second dimension is orthogonal to a line running from a center of the metal pad to the center axis of the base material, where the first dimension is parallel to the line running from the center of the metal pad to the center axis of the base material, and a solder bump in contact with a second surface of the metal pedestal.

One of the major reliability concerns of current and next generation integrated circuits is mechanical failure due to stresses induced by the chip-package interactions (CPI). The packaged integrated circuits are subjected to thermal-mechanical stresses due to a mismatch of the coefficient of thermal expansion of the silicon, lead-free controlled collapse chip connection (C4) bumps, and the organic flip-chip substrate leading to mechanical delamination or cracking in the weaker low-k/ultra-low K (ULK) films within the chip. Aluminum pads or metal pads in the back-end-of-line (BEOL) can lead to high levels of CPI stress within the weak low-k and ultra-low k BEOL levels. In an embodiment of the present invention, offsetting the metal pad reduces CPI stresses in the weaker BEOL levels. In an embodiment of the present invention, an oblong metal pad reduces CPI stresses in the weaker BEOL levels.

The decreasing feature sizes and increasing power/current and performance requirements of the current and next generation integrated circuit devices has led to a need for materials changes in the chip resulting in weaker low-k and ultra low-k films (ULK), increases in the number of fine pitch Cu wiring levels, and use of more stressful under bump metallurgy (UBM)/lead-free C4 bumps and organic laminates [1-2]. All of these contribute to a weaker and highly stressed packaged part susceptible to white C4 bumps due to failure in the BEOL regions of the chip during the assembly or chip-join processing and/or during reliability stressing of the parts. White C4 bumps are C4 bumps that have cracks in the chip metallurgy under the C4 bumps.

The thermal mechanical stresses that are generated in the packaged part during the chip-join reflow process are driven by the mismatch of the coefficient of thermal expansion of the chip, the lead-free solder, and the organic flip-chip substrate, which leads to delaminations or cracks in the weaker low-k/ULK levels in the chip. These thermally induced tensile stresses are typically worse at the chip edge than the chip center. Several factors can influence the stresses that arise due to chip-package interactions and the white bumps underneath the C4 joints. Factors such as materials properties (BEOL, C4, laminate), chip size, final passivation via design, size and thickness, solder bump and UBM (type, orientation, and dimensions), underfill type, chip-join profile, and laminate structure are a few of them. In an embodiment of the present invention, shifting a metal pad towards a center of a base material reduces failure due to tensile stress in a chip. In an embodiment of the present invention, modifying the shape of a metal pad reduces failure due to tensile stress in a chip.

In an embodiment, shifting a metal pad towards the center of the base material or chip reduces peeling stress. In an embodiment, changing the aspect ratio of the metal pad such that the smaller of the two dimensions is in line with a line running substantially from the center of a metal pad to the center of the base material or chip reduces peeling stress.

In an embodiment, the metal pad is connected to a base material. The base material is a multilayer electronic package. In an embodiment, the base material comprises a material selected from the group consisting of a photo sensitive polyimide material, an oxide material, and a nitride material. In an embodiment, the base material comprises a material selected from the group consisting of a photo sensitive polyimide material, a silicon oxide material, and/or a silicon nitride material deposited on a silicon chip. In an embodiment, the metal pad is formed on a surface of the base material. In an embodiment, the metal pad is formed in a recess in the base material. In an embodiment, the metal pad is deposited within the base material. In an embodiment, the metal pad is an aluminum pad that has been deposited by sputtering or electroplating. In an embodiment, the metal pad is deposited onto an area of the base material with a metal via or metal component. The metal pad is conductively coupled to the metal filled via or metal component. In an embodiment, the metal pad comprises a material selected from the group consisting of gold, gold alloy, copper, copper alloy, aluminum, and aluminum alloy. In an embodiment, the metal pad is an aluminum pad. In an embodiment, the base material is a chip.

In an embodiment, a passivation layer is formed on the exposed portion of the base material and a portion of the metal pad. In example, once the metal pad is formed, the passivation layer may be deposited onto the surface of the base material and the metal pad leaving a via or open region on the metal pad with no passivation layer. In an embodiment, there is a passivation layer between the metal pedestal and the metal pad with a via in the passivation layer, and where the metal pedestal contacts the metal pad through the via in the passivation layer. In an embodiment, the passivation layer is a dielectric passivation layer. For example, the passivation layer could be comprised of an organic material, such as a polymer. The passivation layer could also be comprised of a photosensitive polyimide. In an embodiment, the passivation layer has a thickness ranging from 0 μm to 20 μm.

In an embodiment, a metal pedestal is formed, at least partially, on the surface of the metal pad. In an embodiment, the metal pedestal is also formed partially on a surface of the passivation layer. In an embodiment, the metal pedestal is partially formed on the surface of the base material. In an embodiment, the metal pedestal comprises a material selected from the group consisting of gold, gold alloy, copper, copper alloy, aluminum, aluminum alloy, titanium, and tantalum nitride. In an embodiment, the metal pedestal is deposited on the passivation layer and the second surface of the metal pad. For example, the metal pedestal may be deposited by electroless plating. In a further embodiment, the electroless plating may be a seed layer and the metal pedestal may be further deposited by electroplating.

In an embodiment, the metal pad is radially offset in regard to the metal pedestal. The metal pad is shifted towards a center axis of the base material. The center axis of the base material is a line running substantially perpendicular to the two largest flat surfaces of the base material. In an embodiment, the offset distance ranges from 0 μm to 20 μm. The offset distance can be measured from a center axis of the metal pad to a center axis of the pedestal. In an embodiment, during construction, the metal pad is deposited at an offset with reference to where the metal pedestal will be placed. In an embodiment, the metal pedestal is offset from the center axis of the metal pad, where the metal pedestal is shifted away from a center axis of the base material.

In an embodiment, first dimension of the metal pad is smaller than a second dimension of the metal pad, wherein the second dimension is orthogonal to a line running from a center of the metal pad to the center axis of the base material, wherein the first dimension is parallel a to line running from the center of the metal pad to the center axis of the base material. In an embodiment, the metal pad has a cross sectional shape selected from the group consisting of rounded rectangle, elliptical, and oblong. For example, the metal pad can be any polygon or curve shape that has a face or cross section with one dimension larger than another. The cross-section does not need to be symmetrical. The cross-sectional shape could have any number of sides. In an embodiment, an aspect ratio of the second dimension to the first dimension is greater than 1:1 and less than 2:1.

In an embodiment, a solder bump is formed on a surface of the metal pedestal. In an embodiment, the solder bump comprises a material selected from the group consisting of leaded solder, lead free solder, bismuth based lead free solder, silver based lead free solder, copper based lead free solder, and high lead core solder.

Metal Pad Offset

Referring to FIG. 1, in an embodiment, a metal pad 110 is deposited on a base material 120. A metal pedestal 140 is at least partially deposited on metal pad 110. An axis 160 of metal pad 110 is offset from an axis 170 of metal pedestal 140 by an offset distance 165.

In an embodiment, base material 120 has one or more metal filled vias 130 that are electrically connected to metal pad 110. In an embodiment, a passivation layer is formed on metal pad 110 and base material 120. In an embodiment, metal pedestal 140 is formed on a passivation layer 190. In an embodiment, there is not a passivation layer. In an embodiment, metal pedestal 140 is a single coating deposited on metal pad 110 and passivation layer 190. In an embodiment, metal pedestal 140 is a single layer deposited on metal pad 110 and base material 120. In an embodiment, metal pedestal 140 is deposited on a seed layer 150. In an embodiment, axis 160 is a center axis of metal pad 110. Axis 170 is a central axis of metal pedestal 140. Metal pad 110 is shifted towards a center of base material 120 in reference to metal pedestal 140. The shift or offset of metal pad 110 is measured by offset distance 165. For example, passivation layer 190 could be an electrically inert material that could also be an oxygen barrier. In an embodiment, there is no passivation layer. In an embodiment, a solder bump 180 is formed on metal pedestal 140. In an embodiment, structure 100 is part of an electrical component with multiple solder bonds configurations similar to those shown in structure 100. In an embodiment, the configurations shown by structure 100 is used for the solder bonds closest to the corners of the electrical component while others closer to the center of the component may have a different configuration. In an embodiment, structure 100 is part of a chip.

Figure 2:
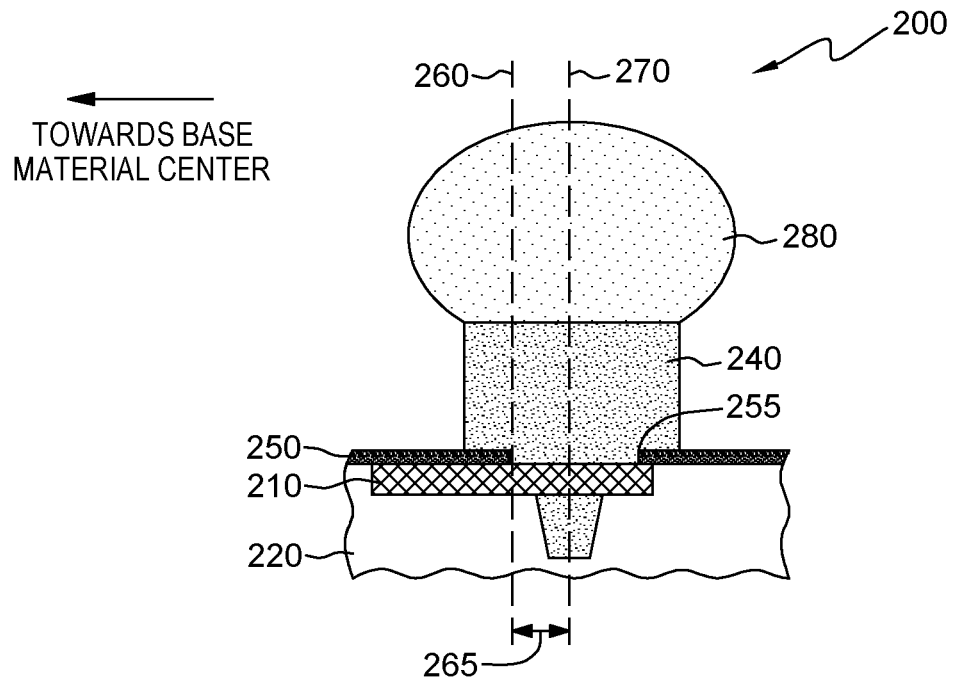
FIG. 2 depicts a diagram in accordance with an exemplary embodiment of the present invention.

Referring to FIG. 2, in an embodiment, a metal pedestal 240 is first deposited with a thin seed layer of metal and then a thicker layer of metal is deposited on the seed layer. In an embodiment, a passivation layer 250, is deposited on a base material 220 and a metal pad 210 with a via 255 in passivation layer 250. In an embodiment, metal pedestal 240 is deposited on metal pad 210 and passivation layer 250, where metal pedestal 240 is in electrical contact with metal pad 210. In an embodiment, there is a passivation layer above base material 220 and surrounding metal pedestal 240. In an embodiment, there is no passivation layer. In an embodiment, a solder bump 280 is formed on metal pedestal 240. In an embodiment, metal pad 210 is offset by an offset distance 265, where offset distance 265 is the distance from a central axis 270 of the metal pedestal to a central axis 260 of the metal pad 210. In an embodiment, structure 200 is part of an electrical component with multiple solder bonds configurations similar to those shown in structure 200. In an embodiment, the configurations shown by structure 200 are used for the solder bonds closest to the corners of the electrical component while others closer to the center of the component have a different configuration.

Figure 3:
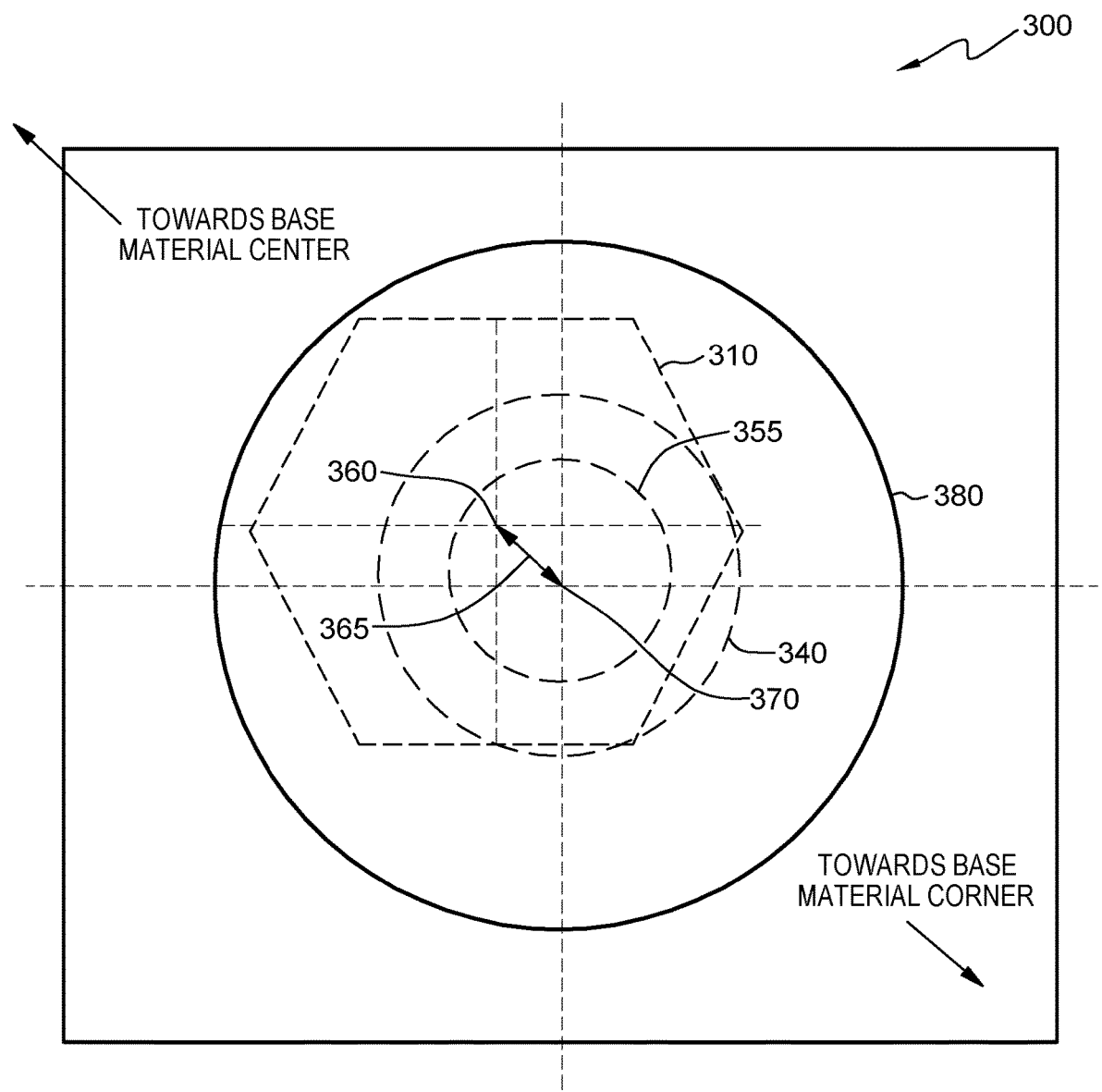
FIG. 3 depicts a diagram in accordance with an exemplary embodiment of the present invention.

Referring to FIG. 3, view 300 is a transparent top down view of a structure according to an embodiment of the invention. In an embodiment, a metal pedestal 340, a via 355 in a passivation layer, and a solder bump 380 are all substantially centered on a common axis 370, and a metal pad 310 is shifted or offset towards a center of a base material by an offset distance 365. In an example, offset distance 365 is measured from common axis 370 to a center axis 360 of metal pad 310. In an embodiment, metal pad 310 is any regular polygon or curved shape. For example, the top surface/cross-sectional view of metal pad 310 is shown to be a hexagon, but it could also be a circle square or octagon.

Metal Pad Shape

Figure 5:
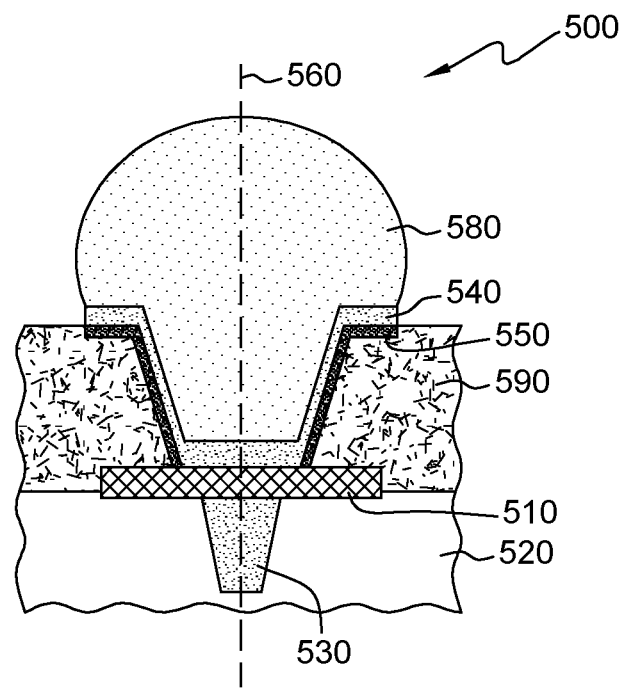
FIG. 5 depicts a diagram in accordance with an exemplary embodiment of the present invention.

Referring to FIG. 5, in an embodiment, a metal pad 510 is deposited on a base material 520. A metal pedestal 540 is at least partially deposited on metal pad 510.

In an embodiment, base material 520 has one or more metal filled vias 530 that are electrically connected to metal pad 510. In an embodiment, a passivation layer 590 is formed on metal pad 510 and base material 520. In an embodiment, metal pedestal 540 and seed layer 550 is formed on a passivation layer 590. In an embodiment, there is not a passivation layer 590. In an embodiment, metal pedestal 540 and seed layer 550 are two coatings deposited on metal pad 510 and passivation layer 590. In an embodiment, metal pedestal 540 and seed layer 550 are two coatings that are deposited on metal pad 510 and base material 520.

In an embodiment, axis 560 is, substantially, a central axis of metal pad 510 and metal pedestal 540. In an embodiment, passivation layer 590 is partially deposited on metal pad 510. For example, passivation layer could be an electrically inert material that could also be an oxygen barrier. In an embodiment, there is no passivation layer. In an embodiment, a solder bump 580 is formed on metal pedestal 540. In an embodiment, metal pad 510 has a first dimension that is longer than a second dimension, such that a line running parallel to the first dimension would substantially point towards the center of base material 520. In an embodiment, structure 500 is part of an electrical component with multiple solder bonds configurations similar to those shown in structure 500. In an embodiment, the configurations shown by structure 500 is used for the solder bonds closest to the corners of the electrical component while others closer to the center of the component may have a different configuration.

Figure 6:
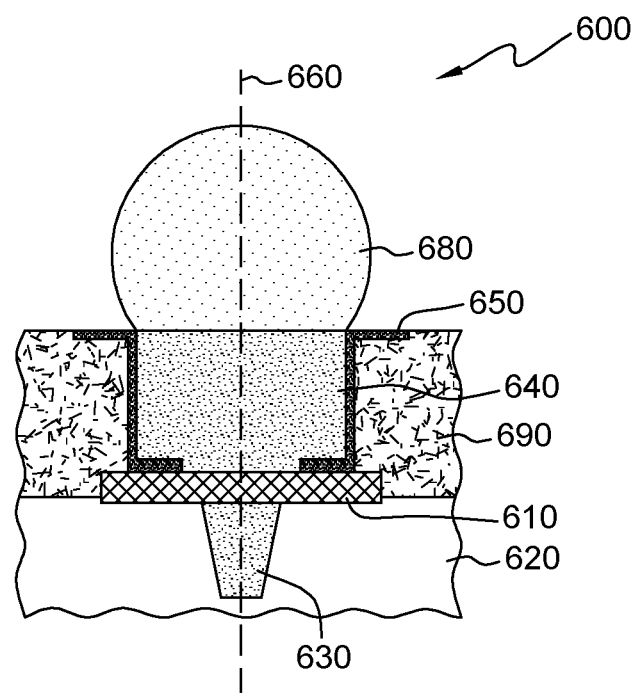
FIG. 6 depicts a diagram in accordance with an exemplary embodiment of the present invention.

Referring to FIG. 6, in an embodiment, a metal pedestal 640 is first deposited with a thin seed layer of metal 650 and then a thicker layer of metal is deposited on seed layer 650. In an embodiment, a passivation layer 690 is deposited on a base material 620 with a via 630 and a metal pad 610. In an embodiment, a passivation layer 690 is deposited on a metal pad 610. In an embodiment, metal pedestal 640 is deposited on metal pad 610 and passivation layer 690, where metal pedestal 640 is in electrical contact with metal pad 610. In an embodiment, there is a passivation layer 690 above base material 620 and surrounding the metal pedestal. In an embodiment, a solder bump 680 is formed on metal pedestal 640. In an embodiment, metal pedestal 640 and metal pad 610 are centered around axis 660. In an embodiment, structure 600 is part of an electrical component with multiple solder bonds configurations similar to those shown in structure 600. In an embodiment, the configurations shown by structure 600 is used for the solder bonds closest to the corners of the electrical component while others closer to the center of the component may have a different configuration.

Figure 7:
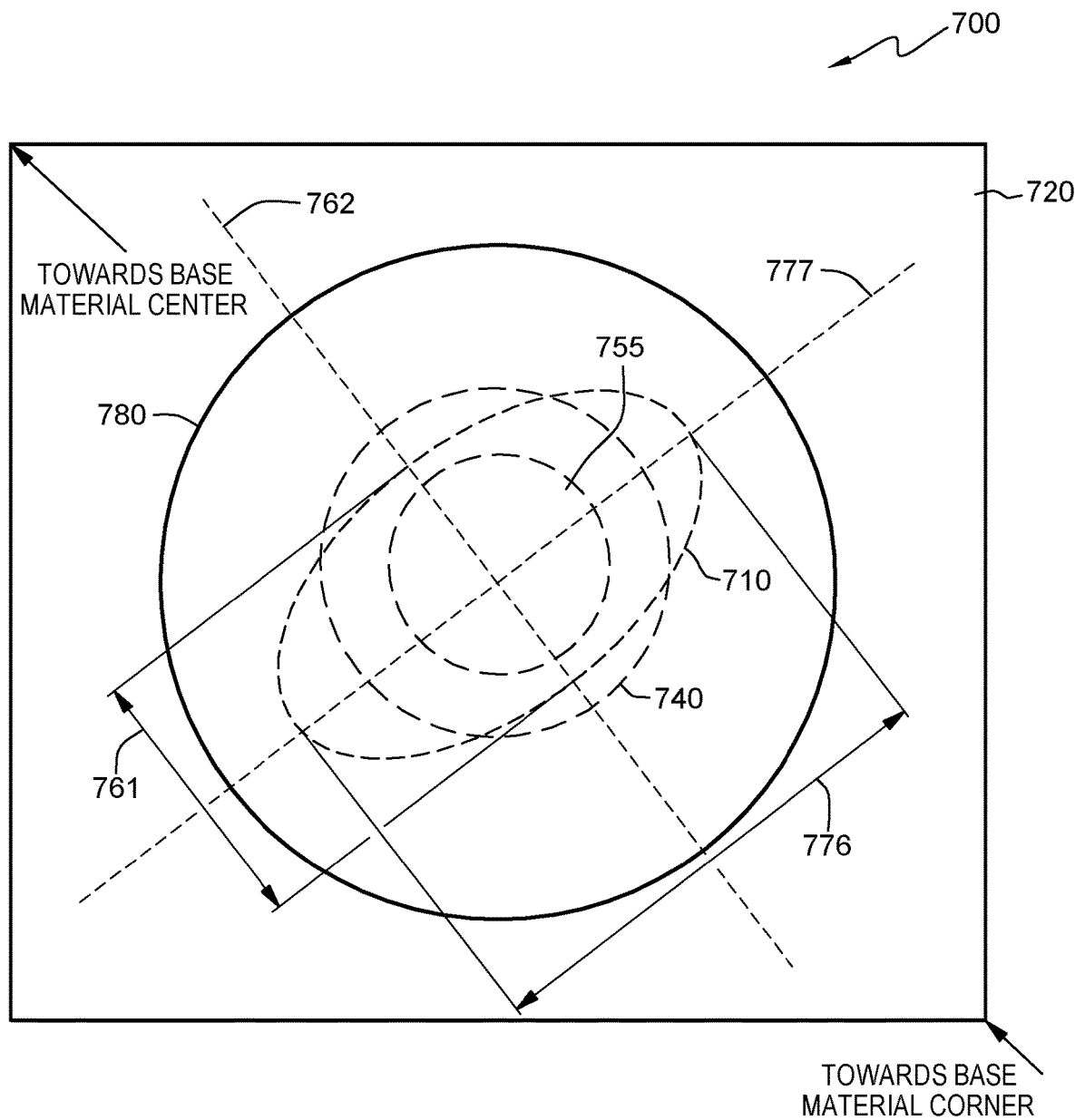
FIG. 7 depicts a diagram in accordance with an exemplary embodiment of the present invention.

Referring to FIG. 7, view 700 is a transparent top down view of the structure according to an embodiment of the invention. In an embodiment, a metal pedestal 740, a via 755 in a passivation layer, a solder bump, and a metal pad 710 are all substantially centered on common axis 760. In an embodiment, metal pad 710 would be shifted towards a center of base material 720. In an embodiment, metal pad 710 is any regular polygon or curved shape with a first dimension 761 that is shorter than a second dimension 776. For example, the top surface/cross-sectional view of metal pad 710 is shown to be an octagon, but it could also be a square with rounded corners or an oblong octagon. In an embodiment, first dimension 761 of metal pad 710 is smaller than second dimension 776 of metal pad 710, where second dimension 776 is substantially orthogonal to a line running through the center of metal pad 710 and the center axis of base material 720, wherein first dimension 761 is substantially parallel to line running through the center of metal pad 710 and the center axis of base material 720.

In an embodiment, each of FIG. 1-3 and FIG. 5-7 depict one section of a larger structure. For example, an array of the structures where each of view 100, 200, 300, 500, 600, and 700 could be one structure in such an array.

Some embodiments of the present disclosure are shown in FIG. 1-3 and FIG. 5-7. In an exemplary embodiment, the structure includes a base material 120, 220, 520, 620, and 720, at least one metal pad 110, 210, 310, 510, 610, and 710, where a first surface of metal pad 110, 210, 310, 510, 610, and 710 is in contact with a surface of base material 120, 220, 520, 620, and 720. The structure has a first surface of a metal pedestal 140, 240, 340, 540, 640, and 740 that is in contact with a second surface of metal pad 110, 210, 310, 510, 610, and 710. In some embodiments, the first surface of metal pedestal 140, 540, and 640 is in contact with the second surface of metal pad 110, 510, and 610 through seed layer 150, 550, and 650. In the structure, radial alignment of metal pad 110, 210, 310, 510, 610, and 710 is shifted by an offset distance 165, 265, and 365, with respect to metal pedestal 140, 240, and 340, such that metal pad 110, 210, and 310 is shifted towards a center axis of base material 120 and 220. For example, the center axis 160, 260, and 360 of metal pad 110, 210, and 310 is offset from the center axis 170, 270, and 370 of metal pedestal 140, 240, and 340 by the offset distance. Regarding metal pad 110, 210, 310, 510, 610, and 710, a first dimension 761 of metal pad 110, 210, 310, 510, 610, and 710 is smaller than a second dimension 776 of metal pad 110, 210, 310, 510, 610, and 710, where the second dimension 776 of metal pad 110, 210, 310, 510, 610, and 710 is a first line 777 orthogonal to a line running from a center axis 160, 260, and 360 of metal pad 110, 210, 310, 510, 610, and 710 to the center axis of base material 120 and 220, and the first dimension 761 of metal pad 110, 210, 310, 510, 610, and 710 is a line 762 parallel to the line running from the center of metal pad 110, 210, 310, 510, 610, and 710 to the center axis of base material 120 and 220. The structure has a solder bump 180, 280, 380, 580, 680, and 780 in contact with a second surface of metal pedestal 140, 240, and 340.

In an embodiment, a method for producing a bonding structure including, forming a base material 120, 220, 520, and 620, depositing at least one metal pad 110, 210, 310, 510, 610, and 710 on base material 120, 220, 520, 620, and 720, where a first surface of metal pad 110, 210, 310, 510, 610, and 710 is in contact with a surface of base material 120, 220, 520, 620, and 720, depositing a metal pedestal 140, 240, 340, 540, 640, and 740 on the structure, where a first surface of metal pedestal 140, 240, 340, 540, 640, and 740 is in contact with a second surface of metal pad 110, 210, 310, 510, 610, and 710, where a radial alignment of metal pad 110, 210, 310, 510, 610, and 710 is shifted by an offset distance 165, 265, and 365, with respect to metal pedestal 140, 240, 340, 540, 640, and 740, such that metal pad 110, 210, 310, 510, 610, and 710 is shifted towards a center axis of base material 120, 220, 520, 620, and 720, where a first dimension 761 of metal pad 110, 210, 310, 510, 610, and 710 is smaller than a second dimension 776 of metal pad 110, 210, 310, 510, 610, and 710, where the second dimension 776 is orthogonal to a line running from a center of metal pad 110, 210, 310, 510, 610, and 710 to the center axis of base material 120, 220, 520, 620, and 720, where first dimension 761 is parallel to the line running from the center of metal pad 110, 210, 310, 510, 610, and 710 to the center axis of base material 120, 220, 520, 620, and 720, and depositing a solder bump 180, 280, 380, 580, 680, and 780 on the structure in contact with a second surface of metal pedestal 140, 240, 340, 540, 640, and 740.

In an exemplary embodiment, the structure includes a base material 120, 220, 520, 620, and 720, at least one metal pad 110, 210, 310, 510, 610, and 710, where a first surface of metal pad 110, 210, 310, 510, 610, and 710 is in contact with a surface of base material 120, 220, 520, 620, and 720. The structure has a first surface of a metal pedestal 140, 240, 340, 540, 640, and 740 that is in contact with a second surface of metal pad 110, 210, 310, 510, 610, and 710. In the structure, radial alignment of metal pad 110, 210, 310, 510, 610, and 710 is shifted by an offset distance 165, 265, and 365, with respect to metal pedestal 140, 240, and 340, such that metal pad 110, 210, and 310 is shifted towards a center axis of base material 120 and 220. For example, the center axis 160, 260, and 360 of metal pad 110, 210, and 310 is offset from the center axis 170, 270, and 370 of metal pedestal 140, 240, and 340 by the offset distance 165, 265, and 365. The structure has a solder bump 180, 280, 380, 580, 680, and 780 in contact with a second surface of metal pedestal 140, 240, and 340.

In an exemplary embodiment, the structure includes a base material 120, 220, 520, 620, and 720, at least one metal pad 110, 210, 310, 510, 610, and 710, where a first surface of metal pad 110, 210, 310, 510, 610, and 710 is in contact with a surface of base material 120, 220, 520, 620, and 720. The structure has a first surface of a metal pedestal 140, 240, 340, 540, 640, and 740 that is in contact with a second surface of metal pad 110, 210, 310, 510, 610, and 710. Regarding metal pad 110, 210, 310, 510, 610, and 710, a first dimension 761 of metal pad 110, 210, 310, 510, 610, and 710 is smaller than a second dimension 776 of metal pad 110, 210, 310, 510, 610, and 710, where the second dimension 776 of metal pad 110, 210, 310, 510, 610, and 710 is a first line 777 orthogonal to a line running from a center axis 160, 260, and 360 of metal pad 110, 210, 310, 510, 610, and 710 to the center axis of base material 120 and 220, and the first dimension 761 of metal pad 110, 210, 310, 510, 610, and 710 is a line 762 parallel to the line running from the center of metal pad 110, 210, 310, 510, 610, and 710 to the center axis of base material 120 and 220. The structure has a solder bump 180, 280, 380, 580, 680, and 780 in contact with a second surface of metal pedestal 140, 240, and 340. In an embodiment, parallel means substantially parallel. For example, the range could be from −25° to 25° off of parallel. In an embodiment, orthogonal means substantially orthogonal. For example, the range could be from −25° to 25° off of orthogonal.

EXAMPLES

Figure 4:
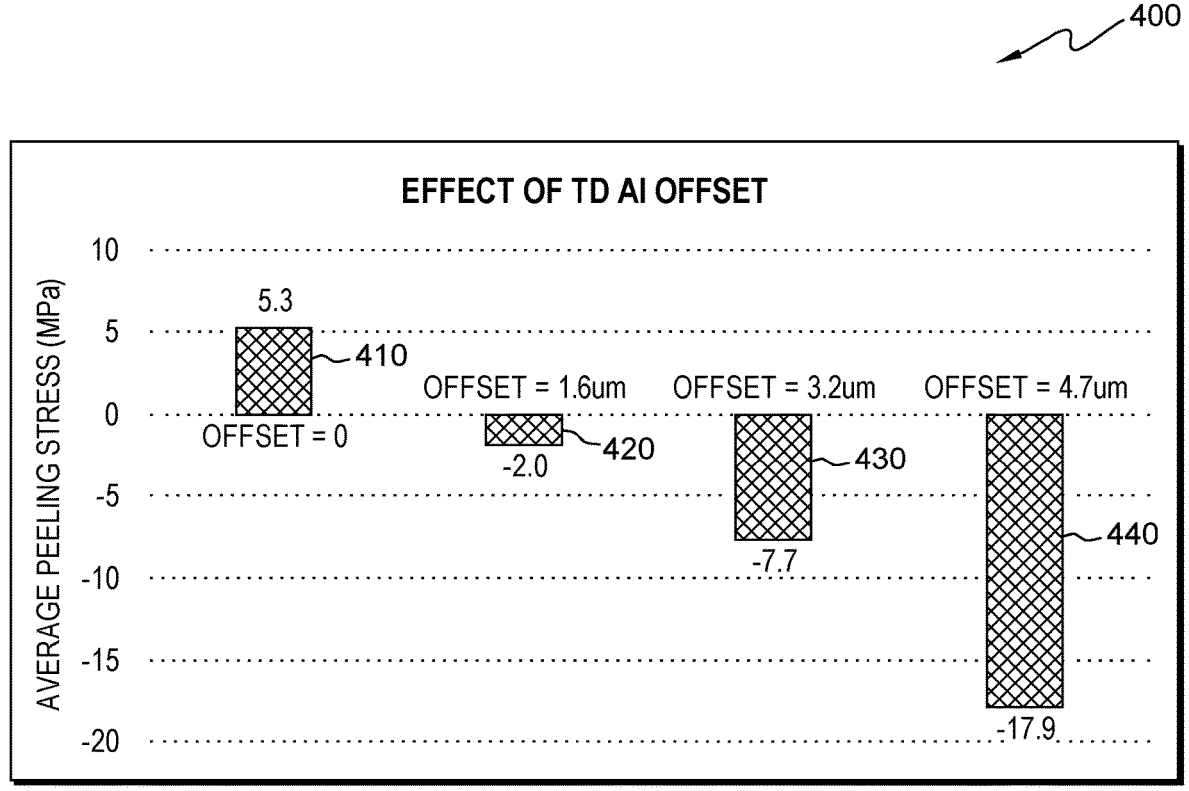
FIG. 4 depicts a bar graph in accordance with an exemplary embodiment of the present invention.

Referring to FIG. 4, using configurations similar to the embodiments shown in FIG. 1-3, it has been observed that the stresses in the ULK layers are sensitive to the metal pad offset distance 165, 265, and 365 as shown in mechanical modeling results 400. According to embodiments of the present invention, the offset distance 165, 265, and 365 of metal pads was varied in a mechanical modeling simulation to determine their effect on the ULK stresses. The variation of average ULK peeling stress as a function of relative metal pad offset distance 165, 265, and 365 is plotted in FIG. 4. In the plots, the ULK stresses in the y-axis and the pad offset distance 165, 265, and 365 in the x-axis have been normalized. Hard dielectric thickness, final passivation (FV) via diameter, metal pad size, metal pad thickness, and the UBM size were held constant for all cases modeled. Bar 410 shows no offset distance 165, 265, and 365 resulted in an average peeling stress of 5.3 MPa. The average peeling stress was reduced as the offset distance 165, 265, and 365 towards a base material center was increased. The bars 420, 430, and 440 show an average peeling stress of −2.0 MPa for an offset distance 165, 265, and 365 of 1.6 µm, −7.7 MPa for an offset distance 165, 265, and 365 of 3.2 µm, and −17.9 MPa for an offset distance 165, 265, and 365 of 4.7 µm.

Figure 8:
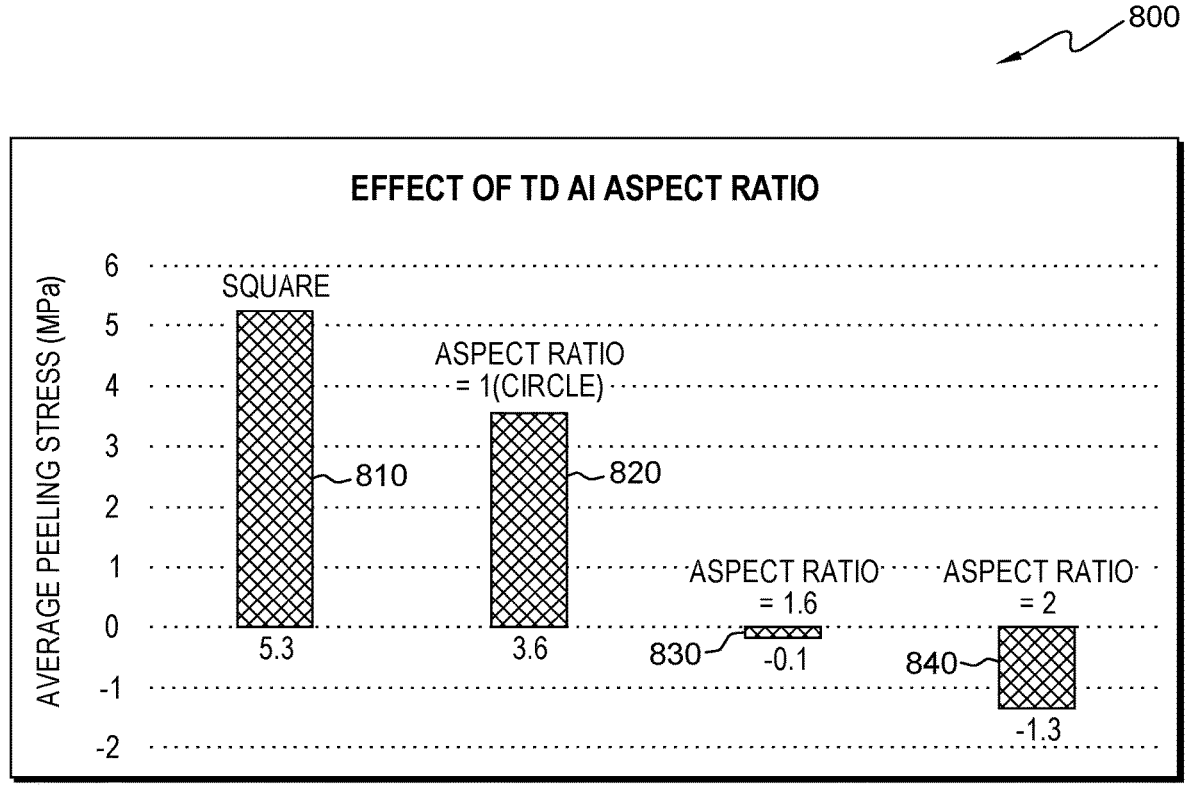
FIG. 8 depicts a bar graph in accordance with an exemplary embodiment of the present invention.

Referring to FIG. 8, using configurations similar to the embodiments shown in FIG. 5-7, it has been observed that the stresses in the ULK layers are sensitive to the metal pad shape and orientation as shown in mechanical modeling results 800. Demonstrating embodiments, shapes of metal pads were varied in a mechanical modeling simulation to determine their effect on the ULK stresses. All orientations were held constant in that smallest dimension 761 was roughly perpendicular to a line running from the center of a base material to the center of the metal pad. The variation of an average ULK peeling stress as a function of relative ratio of the metal pad is plotted in FIG. 8. In the plots, the ULK stresses in the y-axis and the pad aspect ratio in the x-axis have been normalized. Hard dielectric thickness, final passivation (FV) via diameter, overall metal pad size, metal pad thickness, and the UBM size were held constant for all cases modeled. A square shape, depicted by bar 810, resulted in an average peeling stress of 5.3 MPa. The average peeling stress was reduced as an aspect ratio, with largest dimension 776 perpendicular to a line running towards the center axis of the base material, was increased. Bars 820, 830, and 840 show an average peeling stress of 3.6 MPa for an aspect ratio of 1, −0.1 MPa for an aspect ratio of 1.6, and −1.3 for an aspect ratio of 2.

In an embodiment, the metal pad is offset toward the center axis of the base material and has a shape such that a dimension roughly parallel to a line running from the center axis of the base material to a center axis of the metal pad is smaller than a dimension roughly perpendicular to a line running from the center axis of the base material to a center axis of the metal pad.

Figure 9:
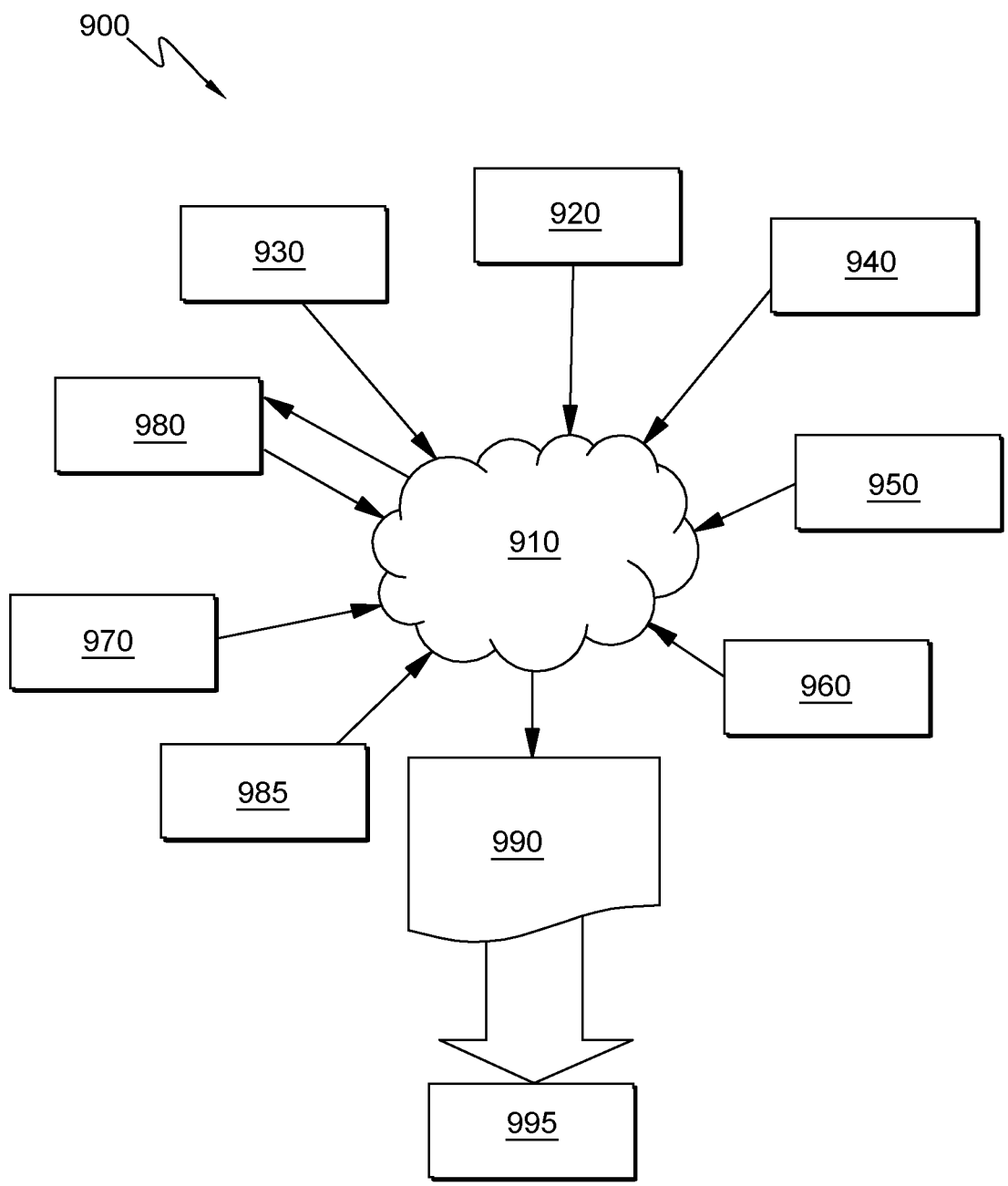
FIG. 9 is a diagram depicting a design process used in semiconductor design, manufacture.

FIG. 9 is a diagram depicting a design process used in semiconductor design, manufacture, and/or testing of structures depicted in FIG. 1-FIG. 3 and FIG. 5-FIG. 7, according to embodiments consistent with the figures.

FIG. 9 illustrates multiple design structures 900 including an input design structure 920 that is preferably processed by a design process. Design structure 920 may be a logical simulation design structure generated and processed by design process 910 to produce a logically equivalent functional representation of a hardware device. Design structure 920 may alternatively include data or program instructions that, when processed by design process 910, generate a functional representation of the physical structure of a hardware device. Whether representing functional or structural design features, design structure 920 may be generated using electronic computer-aided design, such as that implemented by a core developer/designer. When encoded on a machine-readable data transmission, gate array, or storage medium, design structure 920 may be accessed and processed by at least one hardware or software modules within design process 910 to simulate or otherwise functionally represent an electronic component, circuit, electronic or logic module, apparatus, device, or system such as those shown in FIG. 1-FIG. 3 and FIG. 5-FIG. 7. As such, design structure 920 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such, or higher-level design languages.

Design process 910 preferably employs and incorporates hardware or software modules for synthesizing, translating, or otherwise processing a design/simulation functional equivalent of the components, circuits, devices, or logic structures shown in FIG. 1-FIG. 3 and FIG. 5-FIG. 7, to generate a description of the connectivity of an electronic circuit 980 which may contain design structures such as design structure 920. Description of the connectivity of an electronic circuit 980 may comprise, for example, compiled or otherwise processed data structures representing a list of wires, discrete components, logic gates, control circuits, I/O devices, models, etc. that describe the connections to other elements and circuits in an integrated circuit design. Description of the connectivity of an electronic circuit 980 may be synthesized using an iterative process in which description of the connectivity of an electronic circuit 980 is resynthesized at least one times depending on design specifications and parameters for the device. As with other design structure types described herein, description of the connectivity of an electronic circuit 980 may be recorded on a machine-readable data storage medium or programmed into a programmable gate array. The storage medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored through the internet, or other suitable networking means. As used herein, a storage medium upon which a design structure, e.g., 900, 920, or 990, is stored is not to be construed as a transitory signal per se.

Design process 910 may include hardware and software modules for processing a variety of input data structure types including description of the connectivity of an electronic circuit 980. Such data structure types may reside, for example, within library elements 930 and include a set of commonly used elements, circuits, and devices, including models, layouts, and symbolic representations, for a given manufacturing technology, e.g., different technology nodes, 32 nm, 45 nm, 90 nm, etc. The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910, without deviating from the scope and spirit of the disclosure. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures, along with any additional mechanical design or data, to generate a second design structure 990. Design structure 990 resides on a storage medium or programmable gate array in a data format used for the exchange of data of mechanical devices and structures (e.g., any other suitable format for storing or rendering such mechanical design structures).

Similar to design structure 920, design structure 990 preferably comprises at least one files, data structures, or other computer-encoded data or instructions that reside on transmission or data storage media and that generate a logically or otherwise functionally equivalent form of at least one of the embodiments of the disclosure shown in FIG. 1-FIG. 3 and FIG. 5-FIG. 7. In one embodiment, design structure 990 may comprise a compiled, executable HDL simulation model that functionally simulates the devices shown in FIG. 1-FIG. 3 and FIG. 5-FIG. 7.

Design structure 990 may also employ a data format used for the exchange of layout data of integrated circuits and/or symbolic data format (e.g., any other suitable format for storing such design data structures). Design structure 990 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1-FIG. 3 and FIG. 5-FIG. 7. Design structure 990 may then proceed to a state 995 where, for example, design structure 990 proceeds to tape-out, is released to manufacturing, is released to a mask house, is sent to another design house, is sent back to the customer, etc.

It will be understood that when an element is described as being "connected," "deposited on," or "coupled" to or with another element, it can be directly connected or coupled to the other element or, instead, one or more intervening elements may be present.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A structure comprising:
   a base material;
   at least one metal pad,
      wherein a first surface of the metal pad is in contact with a surface of the base material;
   a metal pedestal;
      wherein a first surface of the metal pedestal is in contact with a second surface of the metal pad,
      wherein the metal pad has a cross section that, when viewed in a top-down view, is an elliptical shape, and
      wherein an axis running through a shortest diameter of the metal pad is perpendicular to a line running from the center of the metal pad to the center of the base material; and
   a solder bump in contact with a second surface of the metal pedestal.

2. The structure of claim 1 further comprising:
   a passivation layer between the metal pedestal and the metal pad with a via in the passivation layer,
      wherein the metal pedestal contacts the metal pad through the via in the passivation layer; and
      wherein the metal pedestal is deposited on the passivation layer and the second surface of the metal pad.

3. The structure of claim 2, wherein the passivation layer has a thickness ranging from 0 μm to 20 μm.

\* \* \* \* \*